(12) United States Patent
Saito et al.

(10) Patent No.: US 8,314,345 B2
(45) Date of Patent: Nov. 20, 2012

(54) DEVICE MOUNTING BOARD AND SEMICONDUCTOR MODULE

(75) Inventors: Koichi Saito, Osaka (JP); Tetsuya Yamamoto, Osaka (JP)

(73) Assignee: Sanyo Electric Co., Ltd., Osaka (JP)

( * ) Notice: Subject to any disclaimer, the term of this patent is extended or adjusted under 35 U.S.C. 154(b) by 236 days.

(21) Appl. No.: 12/626,807

(22) Filed: Nov. 27, 2009

(65) Prior Publication Data

US 2010/0132992 A1  Jun. 3, 2010

(30) Foreign Application Priority Data

Nov. 28, 2008 (JP) .................................. 2008-305495

(51) Int. Cl.
 *H05K 1/16* (2006.01)
(52) U.S. Cl. ........ 174/260; 361/748; 257/622; 257/669; 257/701; 257/730; 257/753; 257/758; 257/774; 257/778; 438/122
(58) Field of Classification Search .................. 174/260; 361/748; 257/622, 669, 686, 701, 730, 753, 257/758, 774, 778; 438/122
See application file for complete search history.

(56) References Cited

U.S. PATENT DOCUMENTS

| | | | | |
|---|---|---|---|---|
| 2001/0028110 A1* | 10/2001 | Andoh | .......................... | 257/737 |
| 2001/0049187 A1* | 12/2001 | Enomoto et al. | .............. | 438/618 |
| 2003/0116790 A1* | 6/2003 | Kikuchi et al. | ............... | 257/208 |
| 2003/0227095 A1* | 12/2003 | Fujisawa et al. | ............... | 257/782 |
| 2004/0009630 A1* | 1/2004 | Andoh | .......................... | 438/122 |
| 2004/0089470 A1* | 5/2004 | Shimoto et al. | ............... | 174/250 |
| 2004/0178491 A1* | 9/2004 | Akram et al. | .................. | 257/686 |
| 2007/0222085 A1* | 9/2007 | Abe et al. | ........................ | 257/778 |
| 2007/0236393 A1* | 10/2007 | Anzai | ..................... | 343/700 MS |
| 2007/0268675 A1* | 11/2007 | Chinda et al. | .................. | 361/748 |
| 2008/0006947 A1* | 1/2008 | Akiba et al. | ................... | 257/778 |
| 2009/0001570 A1* | 1/2009 | Yamano | .......................... | 257/737 |
| 2010/0071940 A1* | 3/2010 | Ejiri et al. | ..................... | 174/257 |

FOREIGN PATENT DOCUMENTS

| | | |
|---|---|---|
| JP | 2000-022052 | 1/2000 |
| JP | 2006-310530 A | 11/2006 |

OTHER PUBLICATIONS

Japanese Office Action, and English translation thereof, issued in Japanese Patent Application No. 2008-305495 dated Aug. 7, 2012.

* cited by examiner

*Primary Examiner* — Xiaoliang Chen
(74) *Attorney, Agent, or Firm* — McDermott Will & Emery LLP

(57) ABSTRACT

In a semiconductor module having the structure in which a bump electrode provided on a wiring layer is connected to a device electrode provided on a semiconductor device, connection reliability between the bump electrode and the device electrode is improved. An insulating resin layer is provided between the semiconductor device and the wiring layer. The bump electrode, formed integrally with the wiring layer and projected from the wiring layer toward the insulating resin layer, is electrically connected to the device electrode provided on the semiconductor device. Part of the height of the wiring layer on the end side in a bump connection area is lower than that of the wiring in a wiring area extending toward the side opposite to the end side.

4 Claims, 15 Drawing Sheets

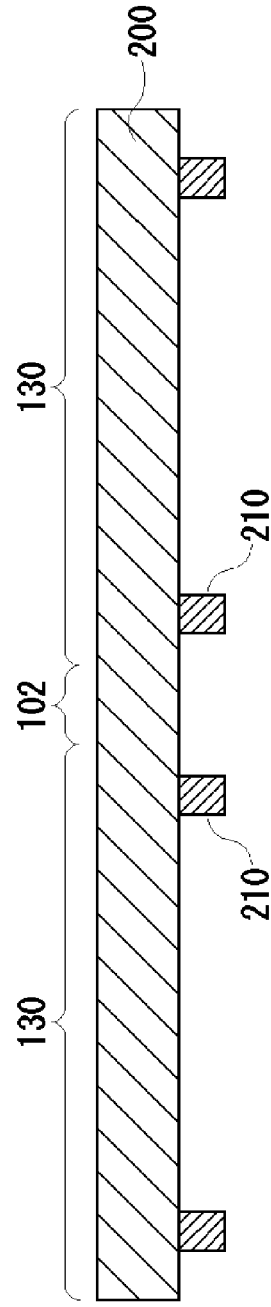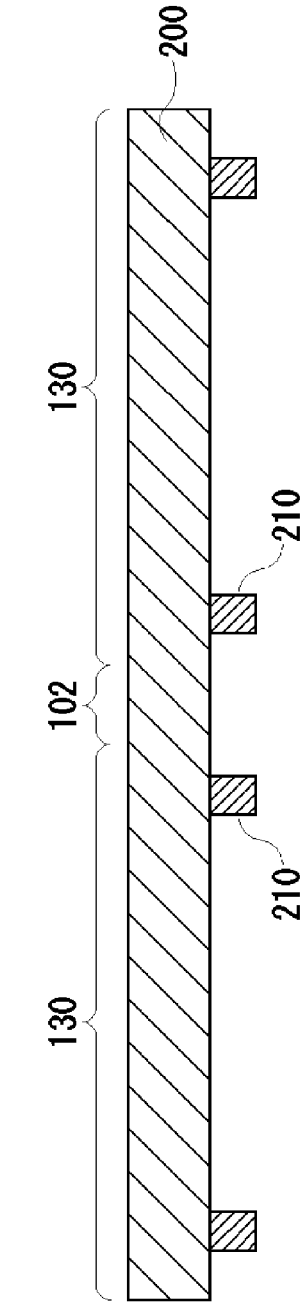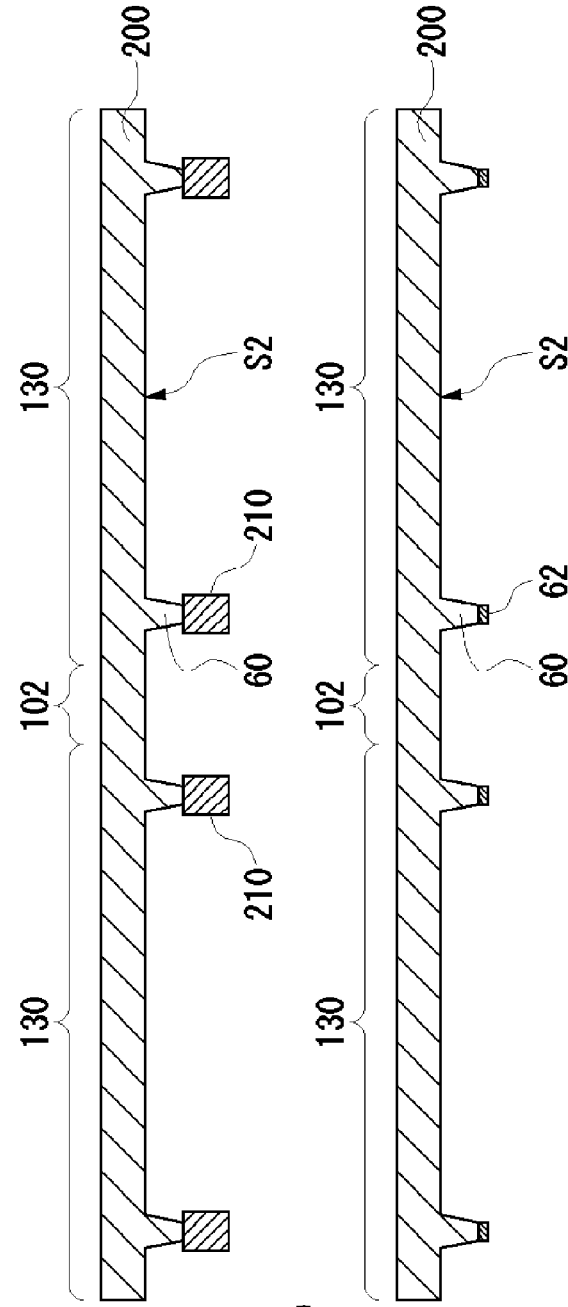

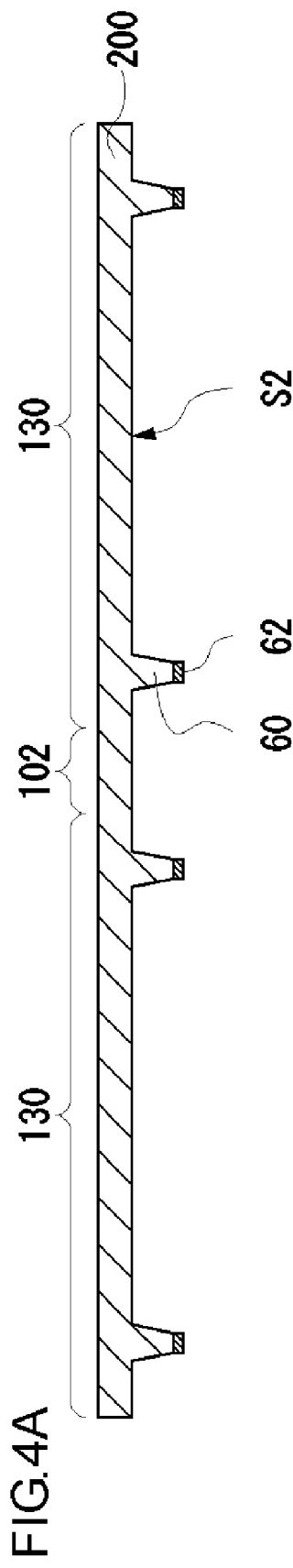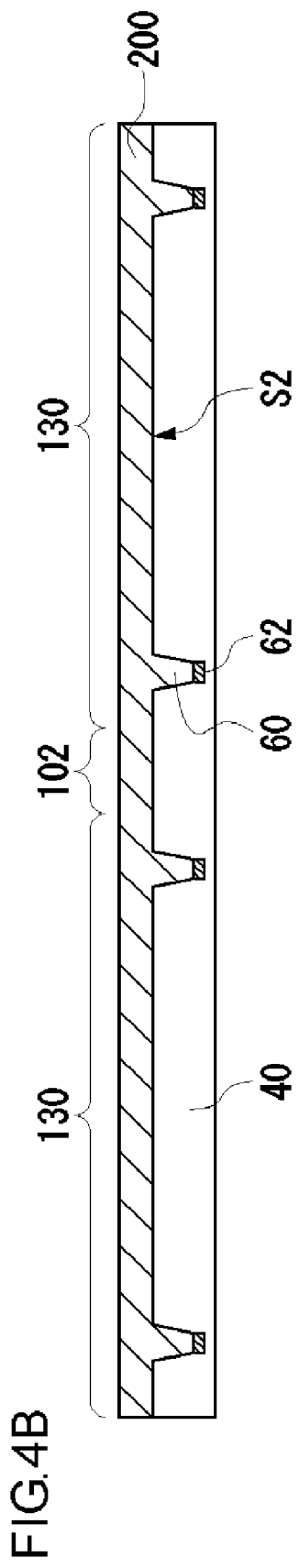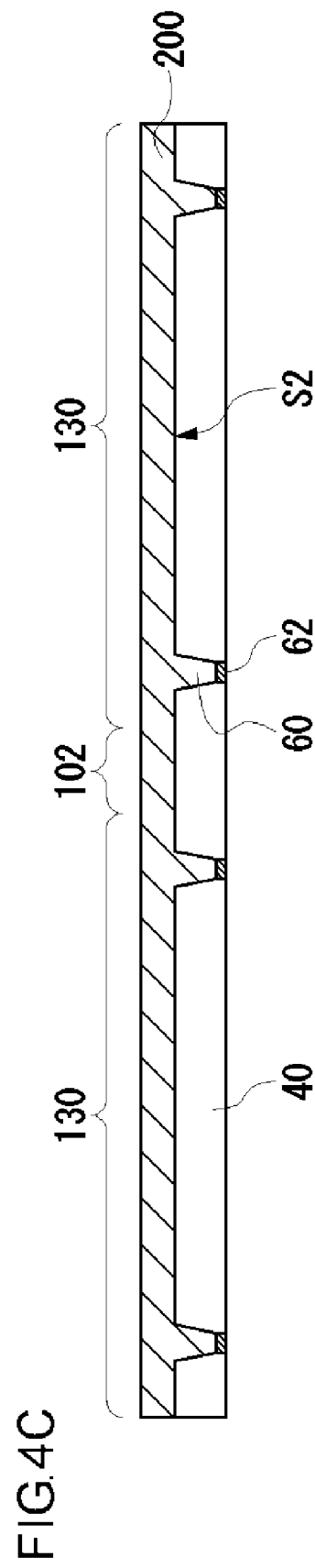

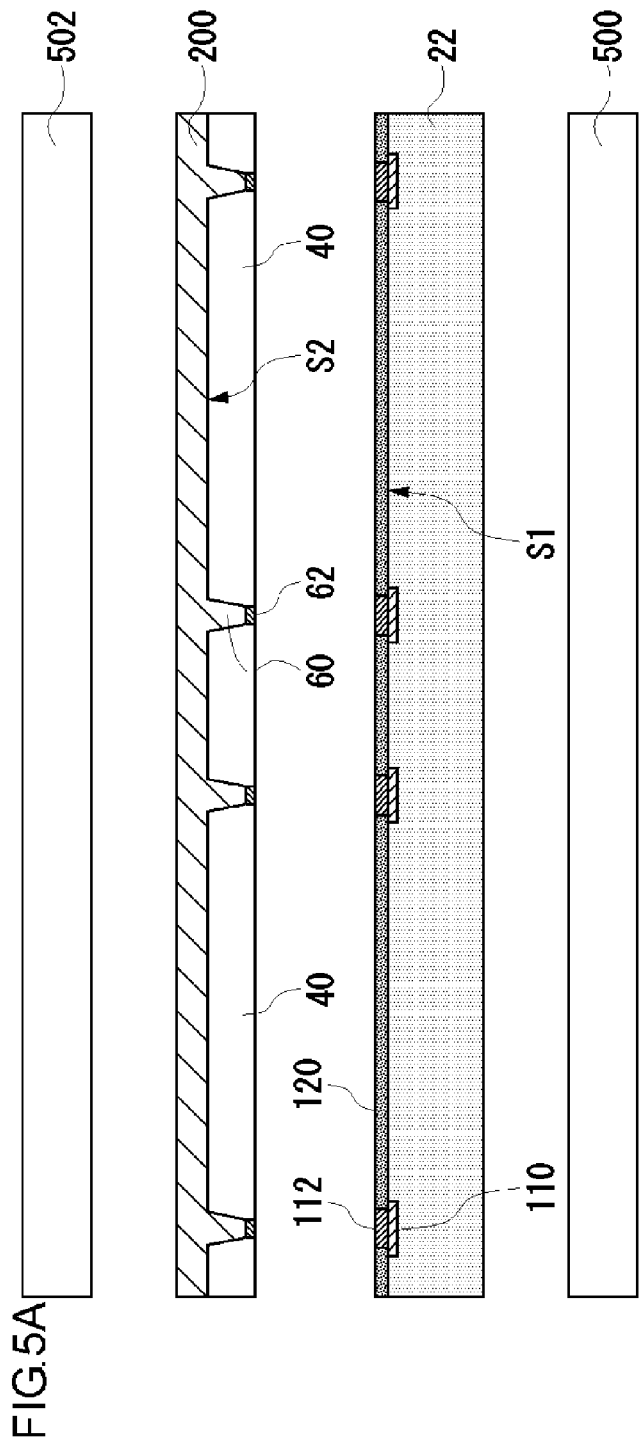
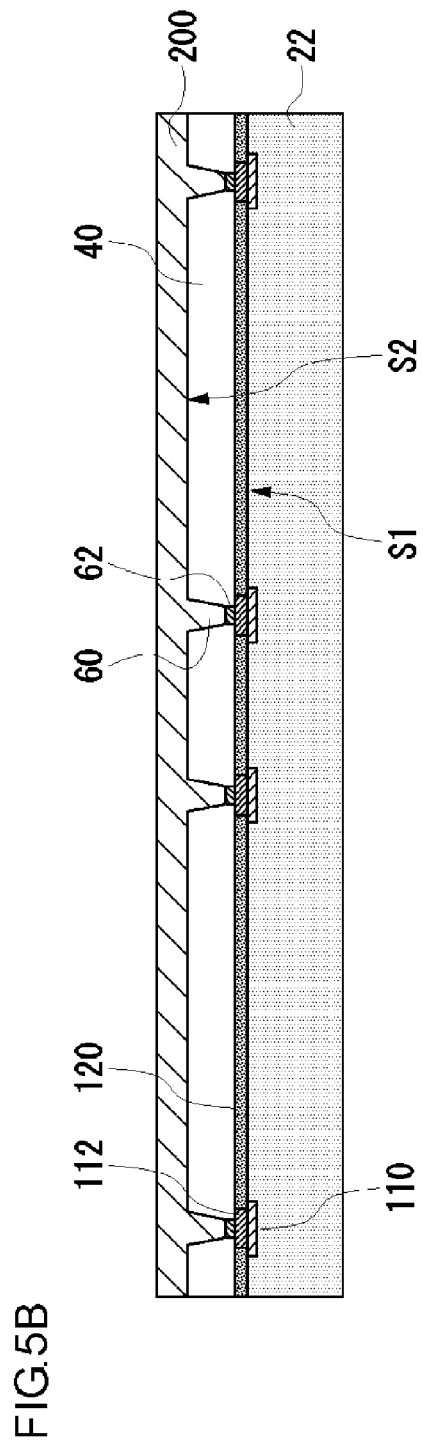
FIG. 5A
FIG. 5B

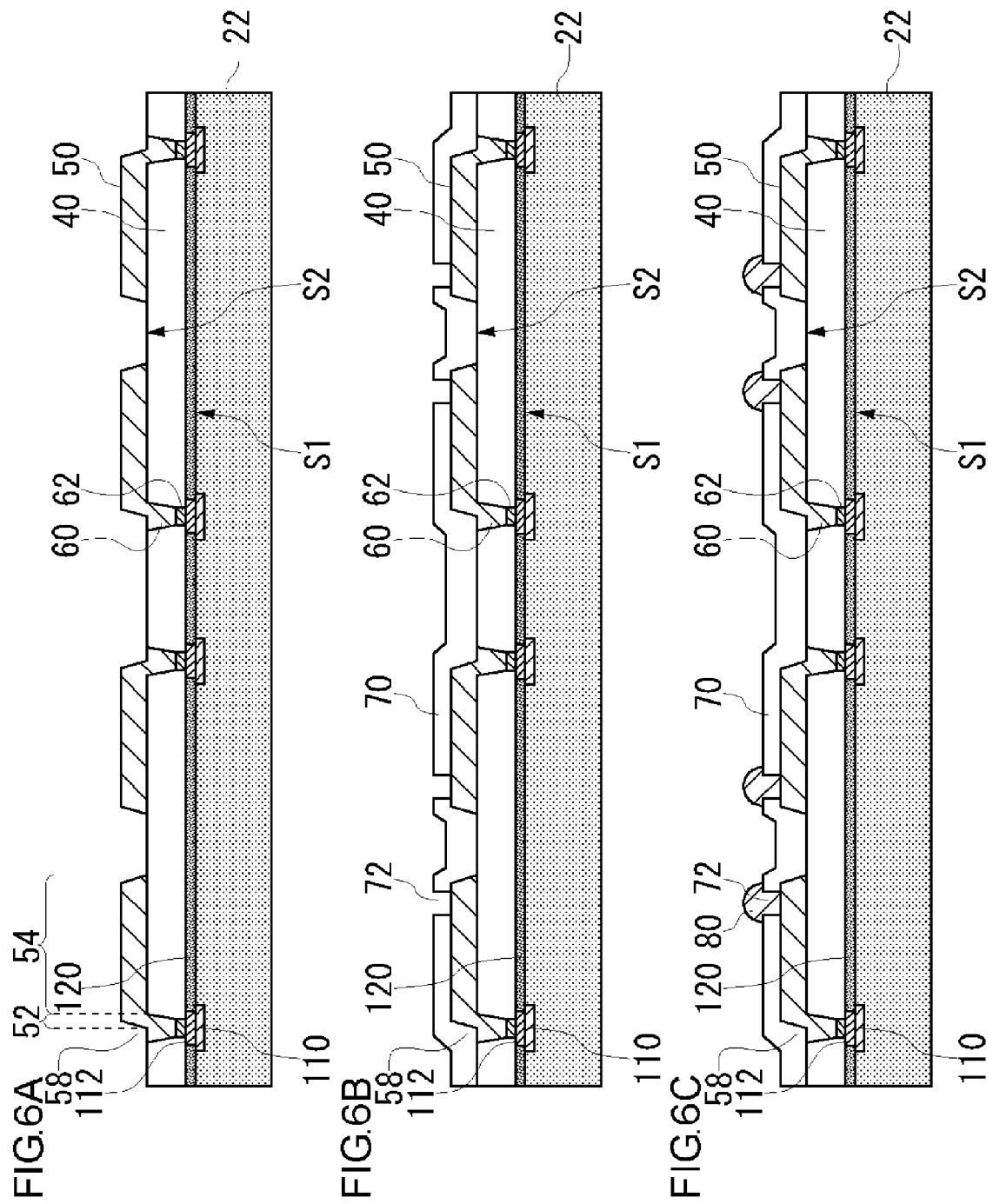

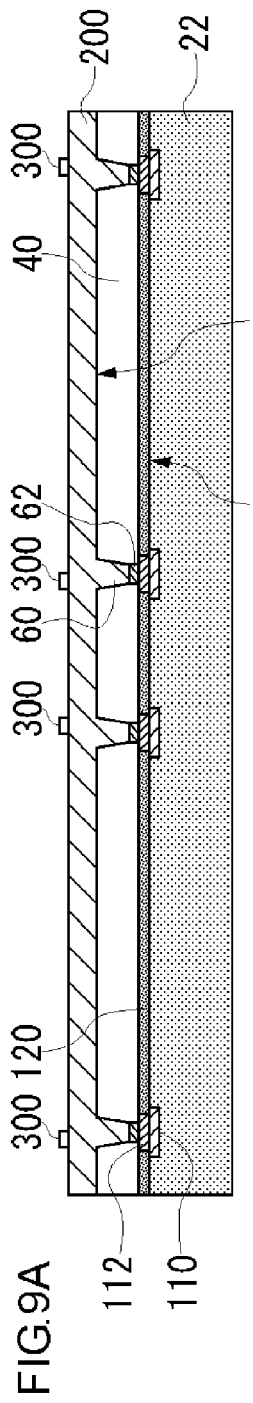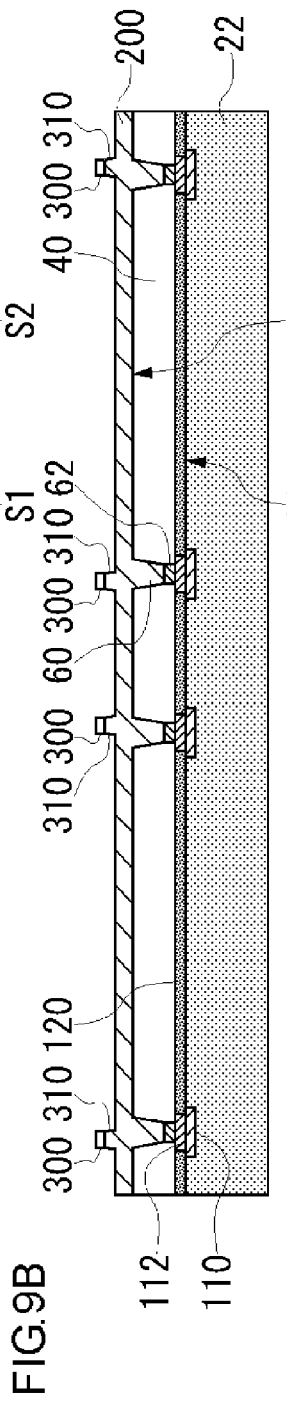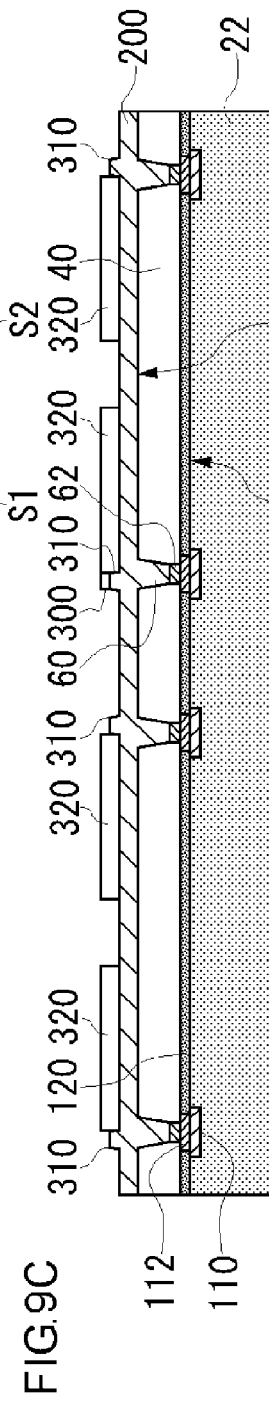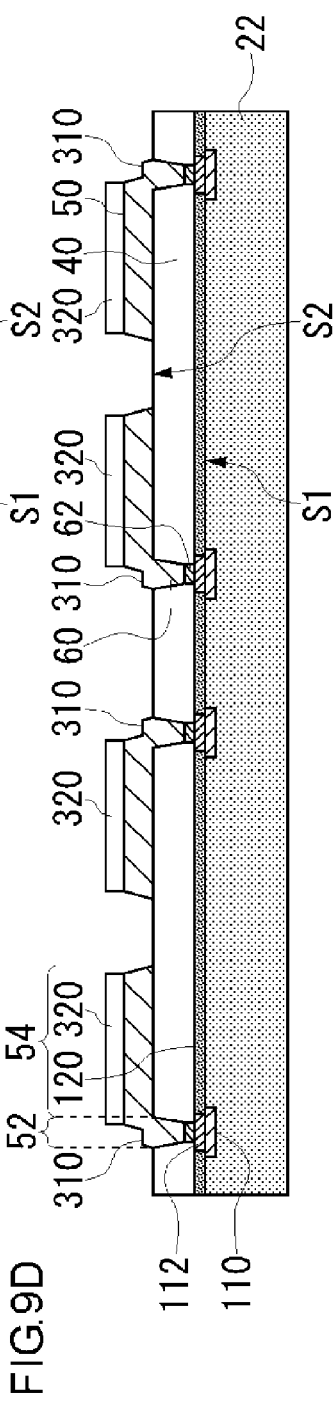

DEVICE MOUNTING BOARD AND SEMICONDUCTOR MODULE

CROSS-REFERENCE TO RELATED APPLICATIONS

This application is based upon and claims the benefit of priority from the prior Japanese Patent Applications No. 2008-305495, filed Nov. 28, 2008, the entire contents of which are incorporated herein by reference.

BACKGROUND OF THE INVENTION

1. Field of the Invention

The present invention relates to a device mounting board and a method of manufacturing the board, a semiconductor module and a mobile device.

2. Description of the Related Art

Recently, with the trend toward miniaturization and high performance of electronic devices, there is a demand for further reduction in the size of semiconductor devices used in electronic devices. With such miniaturization of semiconductor devices, it is of absolute necessity that the pitch between electrodes to enable mounting on a wiring board be made narrower. A known method of surface-mounting a semiconductor device is flip-chip mounting in which solder balls are formed on electrodes of the semiconductor device and the solder balls are soldered to an electrode pad of the wiring board. With this flip-chip method, however, there are restrictive factors for the narrowing of the pitch between electrodes, such as the size of the solder ball itself and the bridge formation at soldering. As one structure used to overcome these limitations, known is a structure where a bump structure formed on a substrate (wiring layer) is used as an electrode or a via, and the electrodes of the semiconductor device are connected to the bump structure by mounting the semiconductor device on the substrate with an insulating resin layer, such as epoxy resin, held between the semiconductor device and the substrate.

However, in the aforementioned structure in which the bump structures formed on the substrate and the electrodes of the semiconductor device are connected together, there is a fear that heat stress generated due to a difference between the coefficients of thermal expansion of the substrate and the semiconductor device, may be concentrated into a connection portion between the bump structure and the substrate. In particular, when stresses in the Z direction (direction in which the bump electrode is peeled off from the silicon substrate (semiconductor device)) are concentrated into the connection portion between the bump electrode and the wiring layer, there is a fear that the connection reliability between the bump electrode and the semiconductor device may be deteriorated.

SUMMARY OF THE INVENTION

The present invention has been made in view of these problems, and a purpose of the invention is to provide a technique of improving the connection reliability between a bump electrode and a device electrode in a semiconductor module having a structure in which the bump electrode provided in a wiring layer of a device mounting board is connected to the device electrode provided in a semiconductor device.

An embodiment of the present invention relates to a device mounting board. The device mounting board comprises: an insulating resin layer; a wiring layer provided on one major surface of the insulating resin layer; and a bump electrode electrically connected to the wiring layer at the end of the wiring layer and configured to be projected from the wiring layer toward the insulating resin layer, wherein part of the height of the wiring layer on the end side is lower than that of the wiring layer in an area of the wiring layer extending toward the side opposite to the end side.

According to the embodiment, when a semiconductor device is mounted by connecting the bump electrode to an external electrode provided on the semiconductor device, thermal stress generated due to a difference between the coefficients of thermal expansion of the wiring layer and a semiconductor substrate used in the semiconductor device, can be suppressed from concentrated into a connection portion between the device electrode and the bump electrode. As a result, the connection reliability between the bump electrode and the device electrode, provided on the wiring layer, can be improved.

In the aforementioned embodiment, the surface of the bump electrode opposite to the top surface thereof may be exposed in the lateral of the wiring layer end. Also, an area of the bump electrode opposite to the top surface thereof may be lacking in the lateral of the wiring layer end.

Another embodiment of the present invention relates to a semiconductor module. The semiconductor module comprises a device mounting board according to anyone of the aforementioned embodiments, and a semiconductor device on which a device electrode facing the bump electrode is provided, in which the bump electrode penetrates the insulating resin layer such that the bump electrode and the device electrode are electrically connected together.

Yet another embodiment of the present invention relates to a method of manufacturing a device mounting board in which an insulating resin layer and a wiring layer are laminated, the method comprising: forming a bump electrode by selectively removing one surface of a metal plate; and forming a wiring layer by selectively removing the other surface of the metal plate, in which, in the forming a wiring layer, the other surface of the metal plate is selectively removed such that the bump electrode is projected from the one surface of wiring layer at the wiring layer end, and that part of the height of the wiring layer on the end side is lower than that of the wiring layer in an area of the wiring layer extending toward the side opposite to the end side. In the forming a wiring layer, the surface of the bump electrode opposite to the top surface thereof may be exposed in the lateral of the wiring layer end.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIGS. 3A to 3D are process sectional views illustrating a method of manufacturing the device mounting board and the semiconductor module according to Embodiment 1;

FIGS. 4A to 4C are process sectional views illustrating a method of manufacturing the device mounting board and the semiconductor module according to Embodiment 1;

FIGS. 5A and 5B are process sectional views illustrating a method of the device mounting board and the semiconductor module according to Embodiment 1;

FIGS. 6A to 6C are process sectional views illustrating a method of manufacturing the device mounting board and the semiconductor module according to Embodiment 1;

FIGS. 9A to 9D are process sectional views illustrating a method of manufacturing the device mounting board and the semiconductor module according to Embodiment 2;

DETAILED DESCRIPTION OF THE INVENTION

Figure 1:
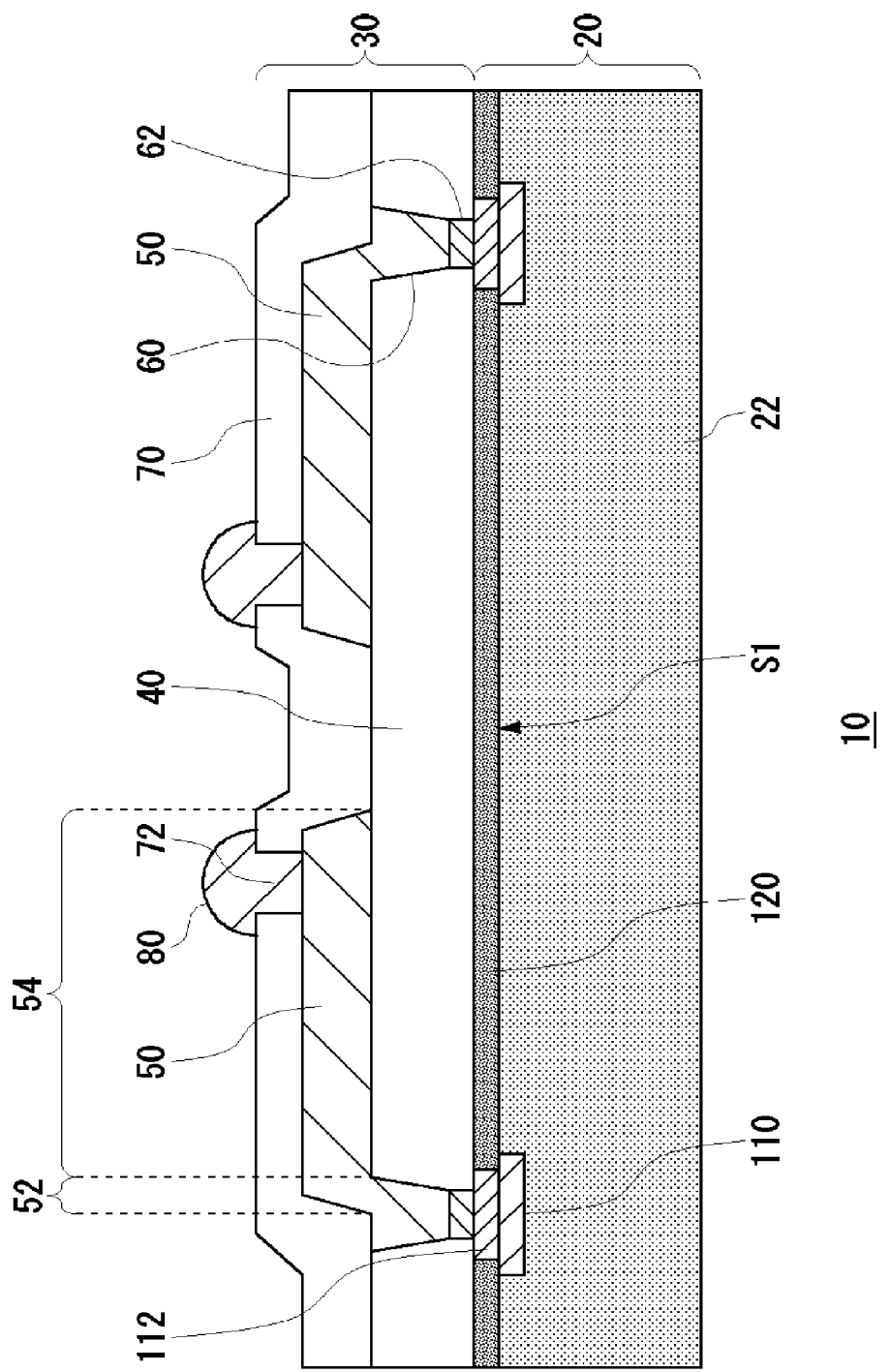
FIG. 1 is a cross-sectional view illustrating the structure of a device mounting board and a semiconductor module according to Embodiment 1.

The invention will now be described by reference to the preferred embodiments. This does not intend to limit the scope of the present invention, but to exemplify the invention.

Hereinafter, embodiments of the present invention will de described with reference to the accompanying drawings. The same or like components illustrated in each drawing are denoted by like reference numerals, and the duplicative descriptions will be appropriately omitted.

Embodiment 1

FIG. 1 is a cross-sectional view illustrating the structure of a semiconductor module according to an embodiment.

The semiconductor module 10 comprises a semiconductor device 20 and a device mounting board 30.

The semiconductor device 20 includes a semiconductor substrate 22, a device electrode 110 and a protective layer 120.

The semiconductor substrate 22 is, for example, a P-type silicon wafer. An integrated circuit (IC) or a large scale integrated circuit (LSI) (not illustrated) is formed on the major surface S1 (upper surface in FIG. 1) of the semiconductor substrate 22 by a known technique. The device electrode 110, an electrode of the semiconductor device, is formed on the major surface S1 (in particular, outer periphery), which is amounting surface.

A metal such as aluminum (Al) or copper (Cu) is used as a material of the device electrode 110. A metallic layer 112 (Ni/Au layers) is provided on the surface of the device electrode 110.

The protective layer 120 is provided on the major surface S1 of the semiconductor substrate 22 such that a predetermined area (central portion) of the metallic layer 112 provided on the surface of the device electrode 110 is exposed. A silicon dioxide film ($SiO_2$), a silicon nitride film (SiN) and a polyimide film, etc. are preferred as the protective layer 120.

The device mounting board 30 comprises: an insulating resin layer 40; a wiring layer 50 (rewiring) provided on the major surface of the insulating resin layer 40 opposite to the semiconductor device 20; and a bump electrode 60 formed integrally with the wiring layer 50, and configured to be projected from the wiring layer 50 toward the insulating resin layer 40.

The insulating resin layer 40 is formed of a material that is made of an insulating resin to undergo plastic flow by, for example, application of pressure. An example of the material that undergoes plastic flow due to application of pressure, includes an epoxy thermosetting resin. The epoxy thermosetting resin used for the insulating resin layer 40 only has to have a viscosity property of, for example, 1 kPa·s under the condition in which temperature is 160° C. and pressure is 8 Mpa. In the epoxy thermosetting resin, the viscosity thereof falls, when applied, foe example, with a pressure of 5 to 15 Mpa under the condition in which temperature is 160° C., to approximately one-eighth in comparison with the case where the resin is applied with no pressure. Contrary to this, under the condition in which temperature is equal to or lower than the glass transition temperature Tg, the epoxy resin at B stage prior to thermal curing does not have viscosity even when applied with a pressure, to the same extent as the case where the resin is applied with no pressure. The epoxy thermosetting resin is a dielectric having a dielectric to constant of approximately 3 to 4.

The wiring layer 50 is provided on the major surface of the insulating resin layer 40 opposite to the semiconductor device 20. The wiring layer 50 is formed of a conductive material, preferably a rolled metal, more preferably rolled copper. The rolled copper is stronger than a metallic film composed of copper made by plating, etc., in terms of mechanical strength, and hence is excellent as a material for rewiring. The wiring layer 50 may also be formed of electrolytic copper, etc. The wiring layer 50 has a bump connection area 52 and a wiring area 54 extending continuously from the area 52. The bump connection area 52 means an area where the wiring layer 50 and the bump electrode 60 are connected integrally with each other. In the bump connection area 52, the bump electrode 60 penetrating the insulating resin layer 40 is provided in a projected manner in accordance with the position of the device electrode 110. In the present embodiment, the wiring layer 50 and the bump electrode 60 are formed integrally with each other, thereby the connection between the wiring layer 50 and the bump electrode 60 are assured. The present embodiment is characterized in that part (inclined portion) of the height of the wiring layer 50 on the end side in the bump connection area 52 is lower than that of the wiring layer 50 (height of, the wiring layer 50 in the flat portion on a solder ball 80 side) in the wiring area 54 extending toward the side opposite to the end side. In other words, part of the end of the wiring layer 50 located in the bump connection area 52 is lacking. Further, in the present embodiment, the bump electrode 60 is projected in the lateral of the wiring layer 50 end in the bump connection area 52, and the surface of the bump electrode 60 opposite to the top surface is exposed.

The bump electrode 60 has the whole shape whose diameter becomes smaller toward the tip thereof. In other words, the side surface of the bump electrode 60 is tapered. The diameters of the tip (top surface) and the base surface of the bump electrode 60 are, for example, approximately 45 μmϕ and approximately 60 μmϕ, respectively. The height of the bump electrode 60 is, for example, 20 μm. In the present embodiment, a metallic layer 62 is provided on the top surface of the bump electrode 60. Ni/Au layers are preferred as the metallic layer 62. The bump electrode 60 and the device electrode 110 are electrically connected by Au—Au bonding between the metallic layer 62 provided on the top surface of the bump electrode 60 and the metallic layer 112 provided on the device electrode 110 in the semiconductor device 20. The bump electrode 60 and the device electrode 110 may be directly connected together without the intermediary of the metallic layers 62 and 112.

A protective layer 70 for preventing oxidization of the wiring layer 50, etc. is provided on the major surface of the wiring layer 50 opposite to the insulating resin layer 40. Examples of the protective layer 70 include a solder resist layer etc. An opening 72 is formed in a predetermined area of the protective layer 70, and part of the wiring layer 50 is exposed by the opening 72. The solder ball 80 is formed within the opening 72 as an externally-connecting electrode, and the solder ball 80 and the wiring layer 50 are electrically connected together. A position where the solder ball 80 is formed, namely an opening 72 formation area is located, for example, at the end where the rewiring (wiring layer 50) is put around.

(Method of Manufacturing Device Mounting Board and Semiconductor Module according to Embodiment 1)

A method of manufacturing the device mounting board and the semiconductor module according to Embodiment 1 is described with reference to FIG. 2 through FIG. 7.

Figure 2:
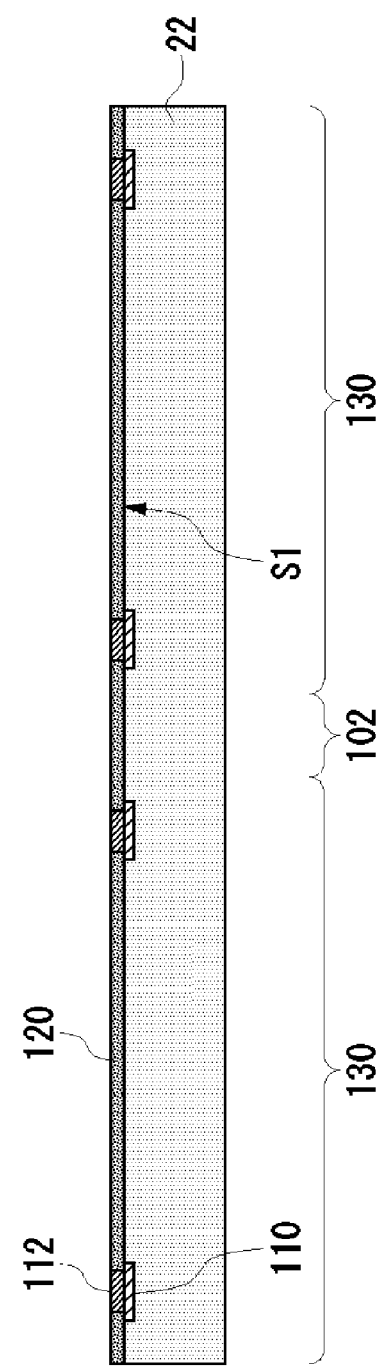
FIG. 2 is a process sectional view illustrating a method of manufacturing the device mounting board and the semiconductor module according to Embodiment 1.

As illustrated in FIG. 2, the semiconductor substrate 22 (6-inch semiconductor wafer) is at first prepared, on the major surface S1 of which the semiconductor module formation areas 130 having the device electrodes 110 and the protective layer 120 are formed, the areas 130 being defined by scribe lines 102 (lines for dividing the semiconductor substrate 22 by scribe in a later process) in advance. FIG. 2 illustrates two semiconductor devices. Specifically, with respect to each of the semiconductor module formation areas 130 in the semiconductor substrate 22 such as a p-type silicon substrate, a predetermined IC and the device electrode 110 located at the outer periphery of the IC, are formed on the major surface S1 of the formation area 130, by using a semiconductor manufacturing process combined with known techniques such as lithographic technique, etching technique, ion implantation technique, film formation technique and heat treatment technique. A metal such as aluminum and copper is adopted as a material for the device electrode 110. The semiconductor substrate 22, on the surface S1 of which excluding the areas where the device electrodes 110 are formed the insulating protective layer 120 for protecting the substrate 22 is formed, is prepared. A silicon dioxide film ($SiO_2$), a silicon nitride film (SiN) or a polyimide (PI), etc. is adopted as the protective layer 120. The metallic layer 112 made of Ni/Au layers is formed on the device electrode 110 in advance.

On the other hand, as illustrated in a FIG. 3A, a copper plate 200 having a thickness larger than at least a total of the height of the bump electrode 60 and the thickness of the wiring layer 50 as illustrated in FIG. 1, is prepared as a metal plate. The thickness of the copper plate 200 is, for example, 125 μm. A rolled metal made of rolled copper is adopted as the copper plate 200.

Subsequently, as illustrated in FIG. 3B, a resist 210 is selectively formed by the lithographic method in line with the pattern corresponding to the bump electrode formation areas. Herein, the array of the bump electrode formation areas corresponds to the positions of the respective device electrodes 110 (see FIG. 2) in the semiconductor substrate 22 divided into a plurality of the semiconductor module formation areas 130 by a plurality of the scribe lines 102. Specifically, the resist 210 is selectively formed on the copper plate 200 by attaching a resist film having a predetermined thickness to the copper plate 200 by using a laminator device to expose the resist film with a photomask having the pattern of the bump electrodes 60, and then by developing the exposed film. In order to improve the adhesion with the resist, it is preferable that the surface of the copper plate 200 is subjected to pre-treatments such as polishing and washing prior to the lamination of the resist film, if necessary. It is preferable that the copper plate 200 is protected by forming a resist protective film (not illustrated) on the whole surface of the plate 200 opposite to the surface (upper surface) where the resist 210 is provided.

Subsequently, as illustrated in a FIG. 3C, the bump electrode 60 having a predetermined truncated cone pattern, projected from the surface S2 of the copper plate 200, is formed by performing wet-etching using a chemical such as a ferric chloride solution, with the use of the resist 210 as a mask. In this case, the bump electrode 60 is formed so as to have a tapered side surface whose diameter (size) becomes smaller toward the tip thereof. The diameters of the base portion and the top portion of the bump electrode 60 according to the present embodiment, and the height thereof are, for example, 100 to 140 μmφ, 50 μmφ, and 20 to 25 μm, respectively.

Subsequently, as illustrated in FIG. 3D, the resist 210 and the resist protective film are peeled off with a parting agent. By the processes described above, the bump electrode 60 is formed integrally with the copper plate 200. Alternatively, a metal mask such as silver (Ag) may be adopted instead of the resist 210. In this case, because the etching selectivity with the copper plate 200 is sufficiently secured, patterning of the bump electrode 60 can be further refined. Further, the metallic layer 62 made of Ni/Au layers is formed on the top surface of the bump electrode 60 with the use of a metal-proof resist (not illustrated) having an opening from which the top surface of the bump electrode 60 is exposed, as a mask.

Subsequently, as illustrated in FIG. 4A, the copper plate 200 is processed to be thinner by etch-backing the surface of the copper plate 200 opposite to the side where the bump electrode 60 is provided, with the use of wet-etching, etc., using a chemical such as a ferric chloride solution. In this case, the resist protective film (not illustrated) is formed on the side where the bump electrode 60 is provided to protect the bump electrode 60, the metallic layer 62 and the copper plate 200, and the resist protective film is removed after the etching. Thereby, the copper plate 200 is processed to a predetermined thickness (thickness of the wiring layer 50), and the copper plate 200 with which the predetermined bump electrode 60 is integrally provided can be formed. The thickness of the copper plate 200 after the wet-etching is approximately 20 μm. It is noted that the copper plate 200 is one example of the "metal plate" of the present invention.

Subsequently, as illustrated in FIG. 4B, the insulating resin layer 40 is laminated on the surface of the copper plate 200 on the side where the bump electrode 60 is provided by using the vacuum laminating method. As stated above, an insulating material that causes plasticity or deformation due to application of a pressure or heating, is adopted as the insulating resin layer 40.

Subsequently, as illustrated in FIG. 4C, the insulating resin layer 40 is processed to be thinner by using the $O_2$ plasma etching technique such that the metallic layer 62 provided on the top surface of the bump electrode 60 is exposed. In the present embodiment, Au is exposed as the surface of the metallic layer 62.

Subsequently, as illustrated in FIG. 5A, the semiconductor substrate 22 and the copper plate 200 with which the bump electrode 60 is integrally formed, are installed between a pair of flat plates 500 and 502 of which a press machine is composed. In this case, positions of the metallic layers 62 and 112, corresponding to each other, are matched together. The flat plates 500 and 502 are formed of, for example, SiC.

Subsequently, as illustrated in FIG. 5B, the semiconductor substrate 22 and the copper plate 200 are pressure-bonded together in a state where the metallic layers 62 and 112 corresponding together are in contact with each other, by pressure molding with the press machine. The pressure and temperature at the press are approximately 17 kN and 200° C., respectively. In the process, the bump electrode 60 and the device electrode 110 are electrically connected by Au—Au bonding between the metallic layer 62 provided on the top surface of the bump electrode 60 and the metallic layer 112 provided on the device electrode 110 in the semiconductor device 20.

Subsequently, as illustrated in FIG. 6A, the wiring layer (rewiring) 50 is formed by processing the copper plate 200 into a predetermined wiring pattern with the lithographic technique and the etching technique. The wiring layer 50 formed by the patterning has the bump connection area 52 having an interface in contact with the bump electrode 60, and the wiring area 54 extending continuously from the area 52. Further, the surface of the bump electrode 60 opposite to the top surface thereof is exposed in the lateral of the wiring layer 50 end in the bump connection area 52. In other words, a constriction area 58 where the wiring layer 50 is lacking in the lateral of the wiring layer 50 end in the bump connection area 52. Herein, the bump electrode 60 means the range between the surface of the wiring layer 50 on the side in contact with the insulating resin layer 40, and the top surface thereof, although the wiring layer 50 and the bump electrode 60 are formed integrally with each other as stated above.

Subsequently, as illustrated in FIG. 6B, after the protective layer (photo solder resist layer) 70 is laminated on the wiring layer 50 and the insulating resin layer 40, the opening 72 is formed in a predetermined area (solder ball-mounted area) of the protective layer 70 with the photolithographic method. The protective layer 70 serves as a film for protecting the wiring layer 50. An epoxy resin, etc., are adopted for the protective layer 70, and the thickness thereof is, for example, approximately 40 μm. Herein, a contact area between the protective layer 70 and the wiring layer 50, and that between the protective layer 70 and the bump electrode 60, are increased with the protective layer 70 entering the constriction area 58, as stated above. Thereby, the adhesion between the protective layer 70 and the wiring layer 50, and that between the layer 70 and the bump electrode 60, can be improved.

Subsequently, as illustrated in FIG. 6C, the solder ball 80 is mounted in the opening 72 of the protective layer 70 with the screen printing method. Specifically, the solder ball 80 is formed by printing a solder paste in which a resin and a solder material are processed into a paste, onto a desired position by the screen mask, and then by heating the paste to the solder melting temperature.

Figure 7:
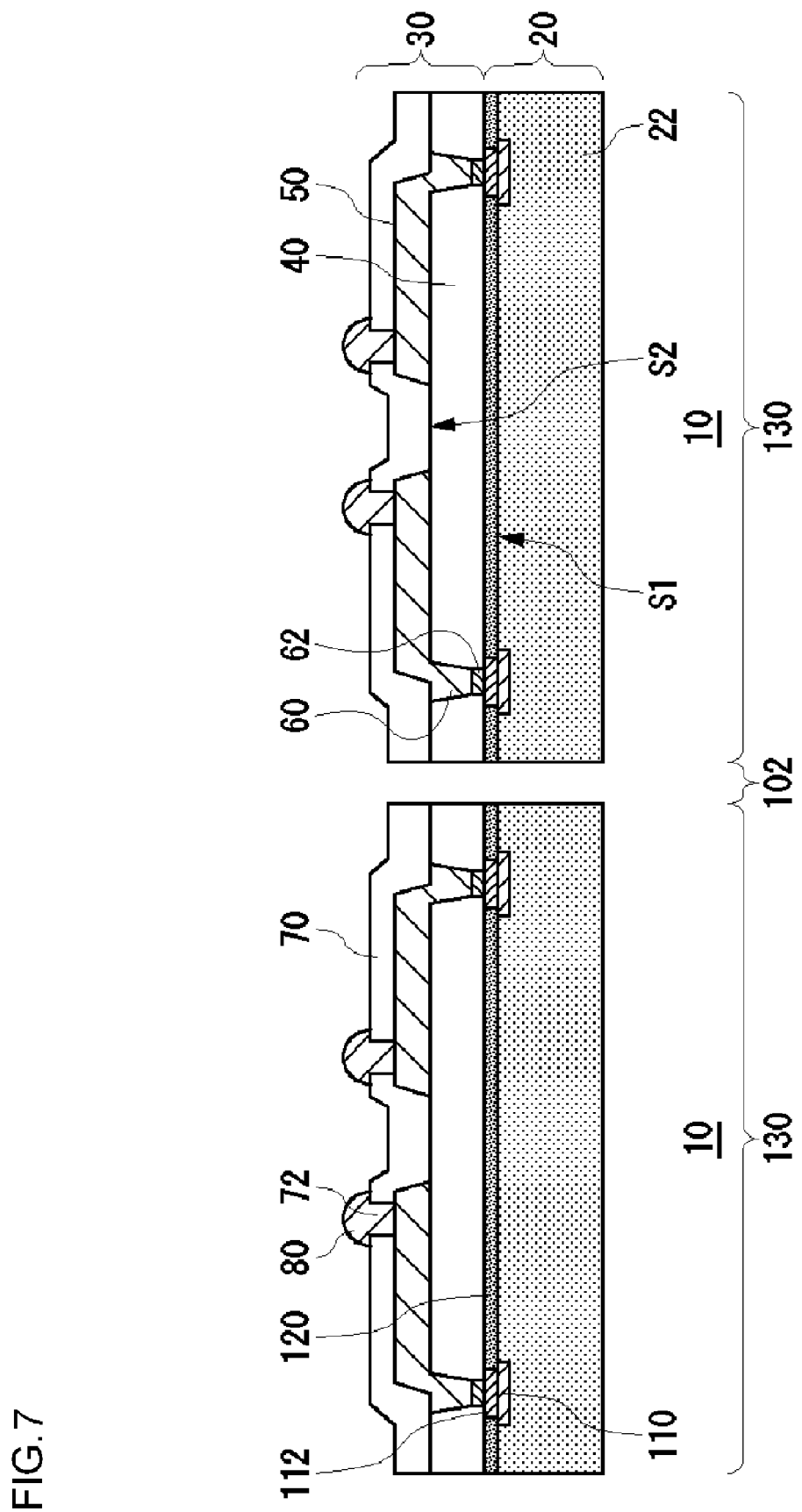
FIG. 7 is a process sectional view illustrating a method of manufacturing the device mounting board and the semiconductor module according to Embodiment 1.

Subsequently, as illustrated in FIG. 7, the semiconductor substrate 22 is individuated into the semiconductor modules 10 by dicing the substrate 22 from the underside (lower surface side) of the substrate 22, along the scribe lines 102 defining a plurality of semiconductor module formation areas 130. Thereafter, residues generated during the dicing are removed by washing the individuated semiconductor module 10 with the use of a chemical. The device mounting board 30 and the semiconductor module 10 according to Embodiment 1 can be manufactured by the processes described above.

According to the semiconductor module directed to the aforementioned Embodiment 1, stresses in the Z direction (direction in which the substrates are laminated) can be suppressed from concentrated into the connection portion between the device electrode 110 and the bump electrode 60 in the bump connection area 52, the stresses being generated by thermal stresses occurring due to a difference between the coefficients of thermal expansion of the wiring layer 50 and the semiconductor substrate 22. As a result, the connection reliability between the bump electrode 60 and the device electrode 110, provided on the wiring layer 50, can be improved.

Embodiment 2

Figure 8:
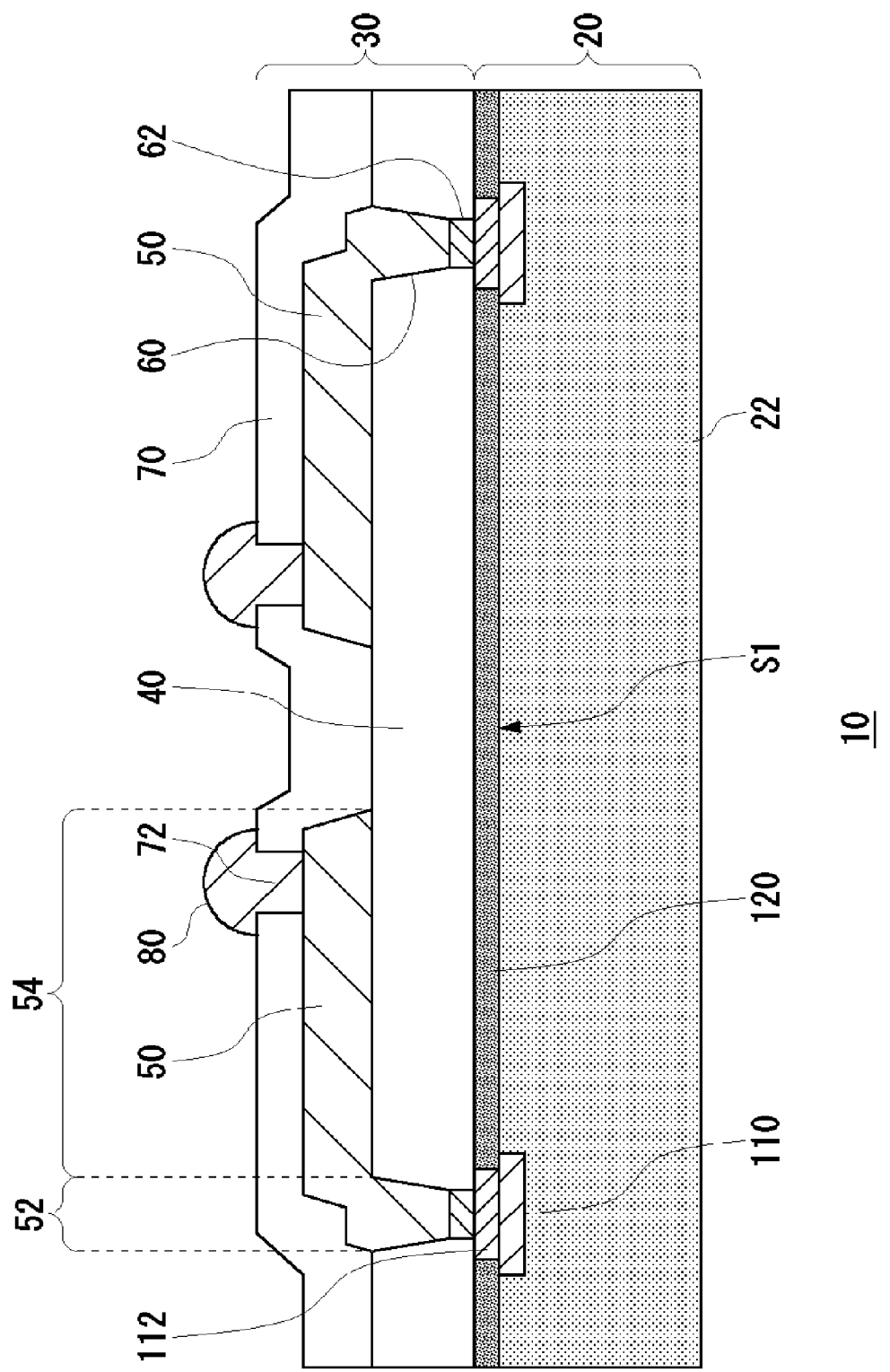
FIG. 8 is a cross-sectional view illustrating the structure of a device mounting board and a semiconductor module according to Embodiment 2.

FIG. 8 is a cross sectional view illustrating the structure of a semiconductor module 10 according to Embodiment 2. The basic structure of the semiconductor module 10 according to Embodiment 2 is the same as that of Embodiment 1 except the structure of the wiring layer 50 in the bump connection area 52. For this reason, with respect to the semiconductor module 10 according to Embodiment 2, descriptions of the same structure as Embodiment 1 will be omitted to focus on the structures different therefrom.

In the semiconductor module 10 according to Embodiment 2, the whole surface of the bump electrode 60 opposite to the top surface thereof (bottom of the bump electrode 60 on the wiring layer 50 side) is designed as the bump connection area 52, and the surface of the bump electrode 60 opposite to the top surface thereof is not exposed. In other words, a bump is formed on the tip side of the wiring layer 50 in the bump connection area 52, making the tip side of the wiring layer 50 thinner than the flat portion on the solder ball 80 side.

(Method of Manufacturing Device Mounting Board and Semiconductor Module according to Embodiment 2)

A basic method of manufacturing a device mounting board and a semiconductor module according to Embodiment 2 is the same as Embodiment 1 except the patterning of the wiring layer. In the present embodiment, as illustrated in FIG. 9A, the resist 300 is formed, among portions corresponding to the bump connection areas, in an area located on the tip side of the wiring layer after the pressure molding illustrated in FIG. 5B.

Subsequently, as illustrated in FIG. 9B, the copper plate 200 is processed to be thinner by the wet etching, etc., with the use of the resist 300 as a mask. A convex portion 310 is formed, among the portions corresponding to the bump connection areas, in an area located on the tip side of the wiring layer, with the copper plate 200 remaining without etched. That is, the thickness of the convex portion 310 is equivalent to the etching depth of the copper plate 200. Thereafter, the resist 300 is removed.

Subsequently, as illustrated in FIG. 9C, a resist 320 corresponding to an area excluding the convex portions 310 from the wiring pattern to be formed, is formed on the copper plate 200.

Subsequently, as illustrated in FIG. 9D, the wiring layer 50 is formed by the wet etching, etc., with the use of the resist 320 as a mask. In the etching, the convex portion 310 is also included in the area to be etched, because the convex portion 310 illustrated in FIG. 9C is exposed. As a result, an area processed to be thinner is formed on the tip side of the bump connection area 52 in the wiring layer 50 formed by the etching. The area processed to be thinner corresponds to the convex portion 310 formation area illustrated in FIG. 9C, and the thickness of the area processed to be thinner is equivalent to the height of the surface of the wiring layer 50 (surface opposite to S2) other than the convex portions 310 illustrated in FIG. 9C. Thereafter, the resist 320 is removed.

The device mounting board and the semiconductor module according to Embodiment 2 can be manufactured by applying the wiring layer formation processes described above.

According to the structure of Embodiment 2, in the same way as Embodiment 1, the stresses in the Z direction (direction in which the substrates are laminated) can also be suppressed from concentrated into the connection portion between the device electrode 110 and the bump electrode 60 in the bump connection area 52, the stresses being generated by thermal stresses occurring due to a difference between the coefficients of thermal expansion of the wiring layer 50 and the semiconductor substrate 22. As a result, the connection reliability between the bump electrode 60 and the device electrode 110, provided on the wiring layer 50, can be improved.

(Considerations by Simulation)

Figure 10:
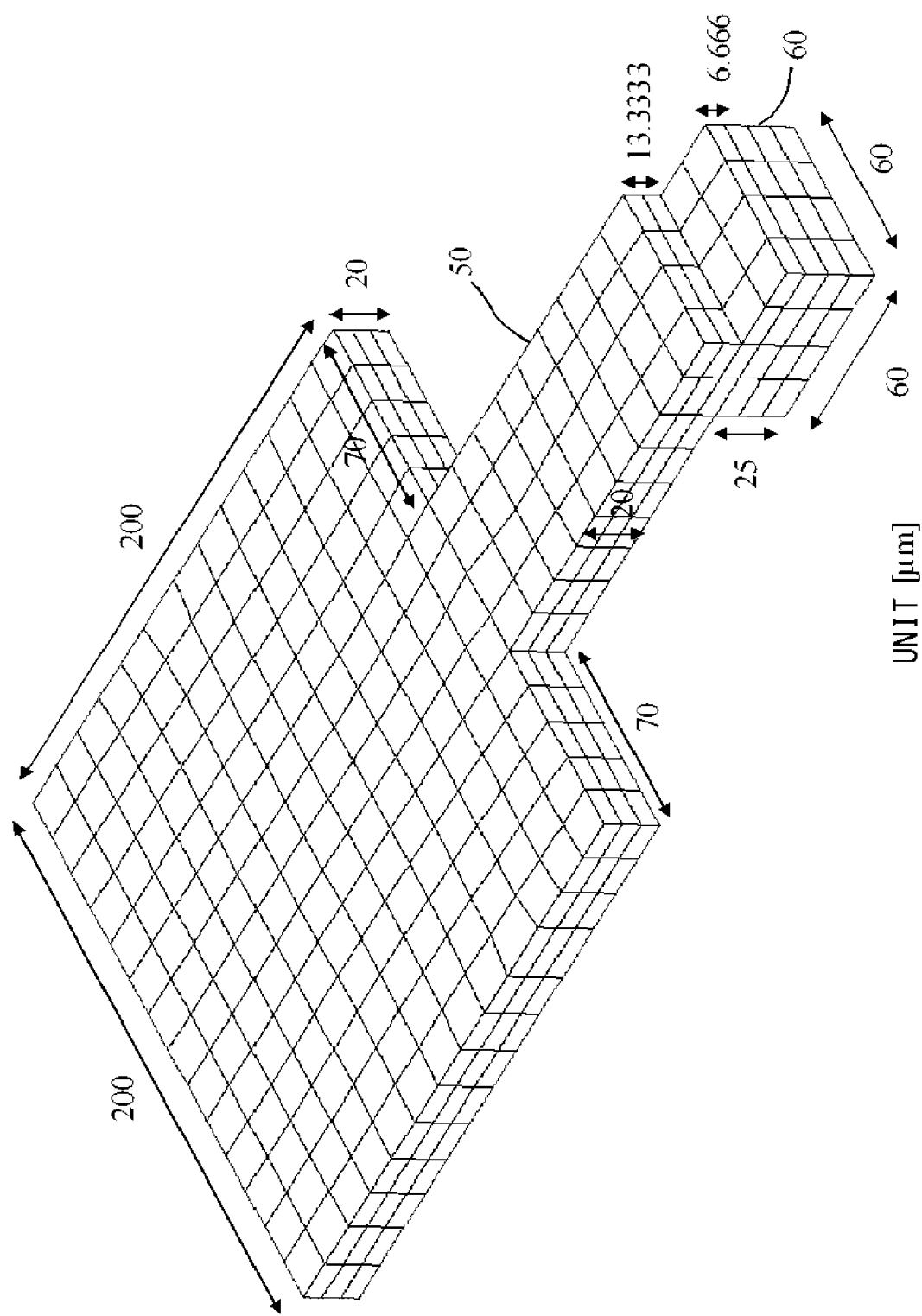
FIG. 10 is a view illustrating the structure and the size of a wiring layer and a bump electrode used in an example model for a thermal stress simulation.
Figure 11:
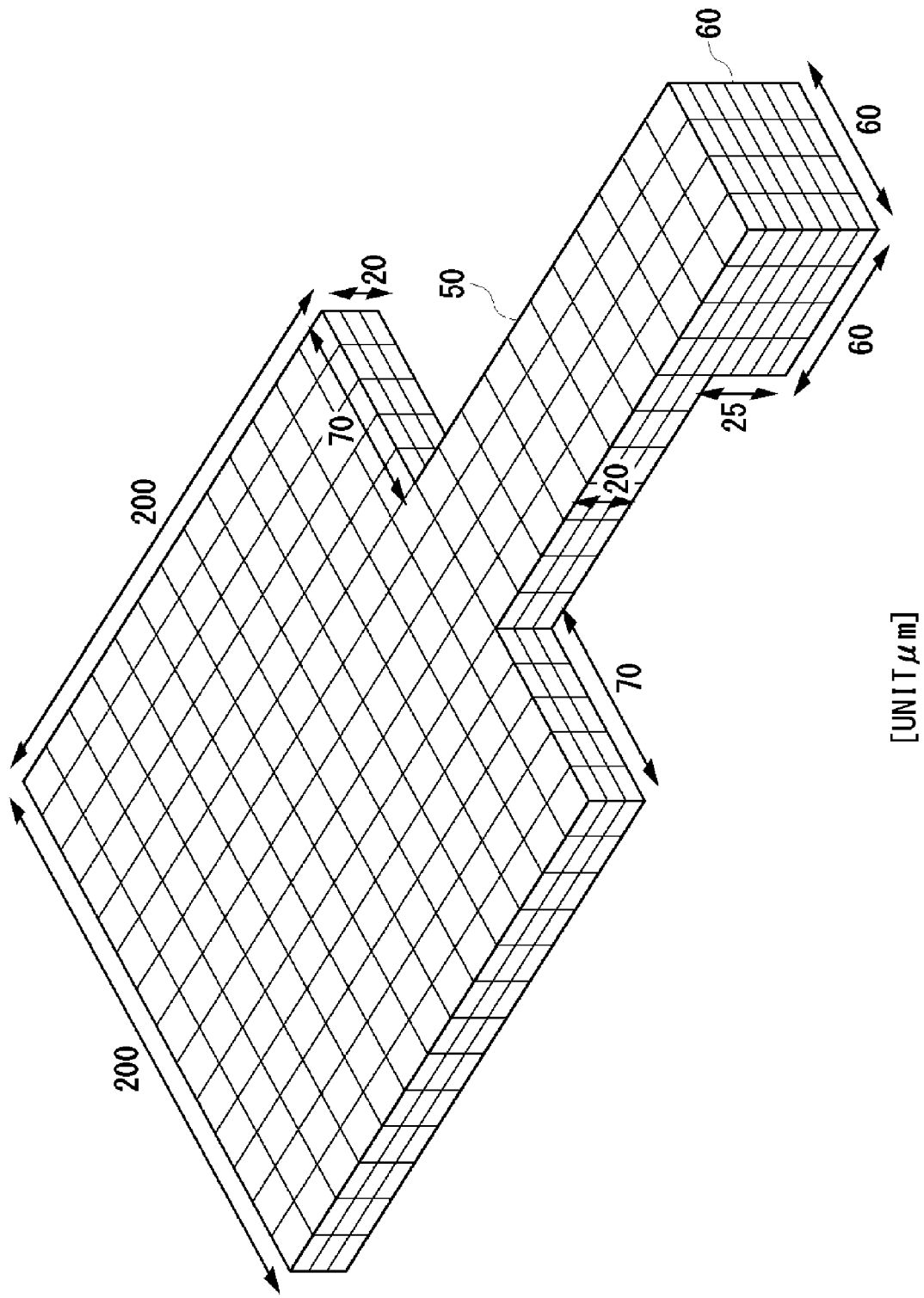
FIG. 11 is a view illustrating the structure and the size of a wiring layer and a bump electrode used in a comparative example model for the thermal stress simulation.

In order to confirm the aforementioned effects, simulations were performed by using the finite element method (Ansys Ver. 11.0). FIGS. 10 and 11 are perspective views illustrating models of the wiring layer and the bump electrode (FIG. 10 illustrates an example model, whereas FIG. 11 a comparative example model) used in the simulations. For simplicity of description, the wiring layer 50 and the bump electrode 60 were designed to be rectangular-shaped. In the example model and the comparative example model, the wiring layers 50 and the bump electrodes 60 are commonly designed as follows: the respective wiring layers were cantilever beams; and the respective bump electrodes 60 were formed at the respective wiring layer 50 tips. The sizes (unit: μm) of the wiring layer 50 and the bump electrode 60 are indicated in FIGS. 10 and 11. In the example model, the wiring layer 50 is made thinner on the wiring layer 50 tip side. On the other hand, in the comparative example model, the thickness of the wiring layer 50 is constant across the whole area including the connection portion with the wiring layer 50.

Figure 12:
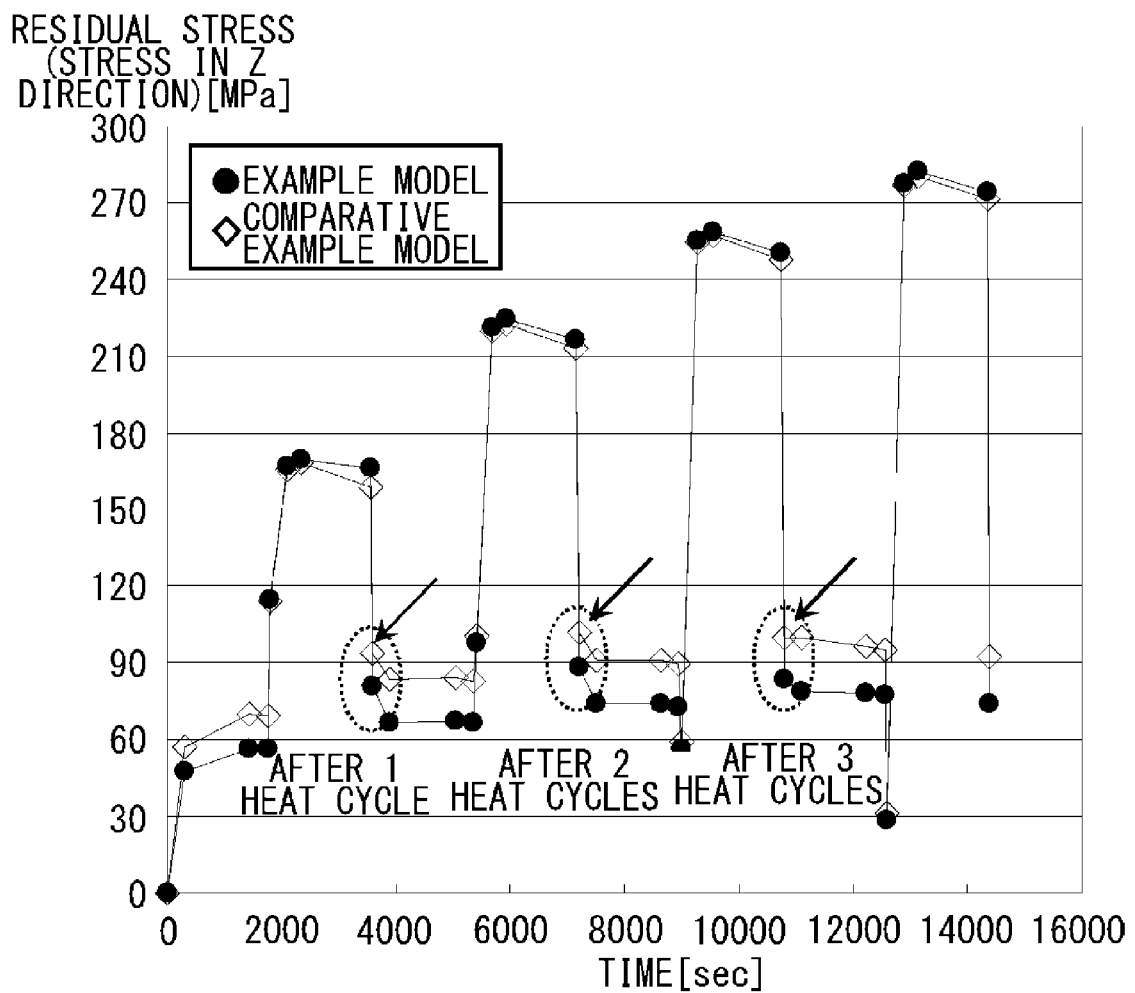
FIG. 12 is a graph illustrating changes in residual stresses obtained by heat cycle tests.

FIG. 12 is a graph illustrating changes in residual stress obtained by heat cycle tests. Table 1 shows residual stress values in the example model and the comparative example model after 1 to 3 heat cycles, respectively. It is noted that the residual stress used herein means the maximum of the stresses occurring in the Z direction during the heat cycle test. It is confirmed that the maximum of the stresses in the Z direction is generated, focusing on the connection portion between the wiring is layer 50 and the bump electrode 60. Conditions of the heat cycle test under which the simulations were performed are shown below.

temperature range: −39° C. to 130° C.
holding time: −39° C.•••5 minutes, 130° C.•••10 minutes
heating-up time: 10 minutes (from −39° C. to 130° C.)
cooling down time: 25 minutes (from 130° C. to −39° C.)
interval between end and start of heating: 60 minutes

TABLE 1

|  | COMPARATIVE EXAMPLE | EXAMPLE | DIFFERENCE |
| --- | --- | --- | --- |
| AFTER 1 CYCLE | 93.87 MPa | 80.85 MPa | 13.02 MPa |
| AFTER 2 CYCLES | 101.92 MPa | 88.21 MPa | 13.71 MPa |
| AFTER 3 CYCLES | 99.73 MPa | 83.25 MPa | 16.48 MPa |

As is clear from FIG. 12 and Table 1, it can be learned that the residual stress in the example model is reduced by approximately 10-20% after each cycle test, in comparison with that in the comparative example model.

Embodiment 3

Figure 13:
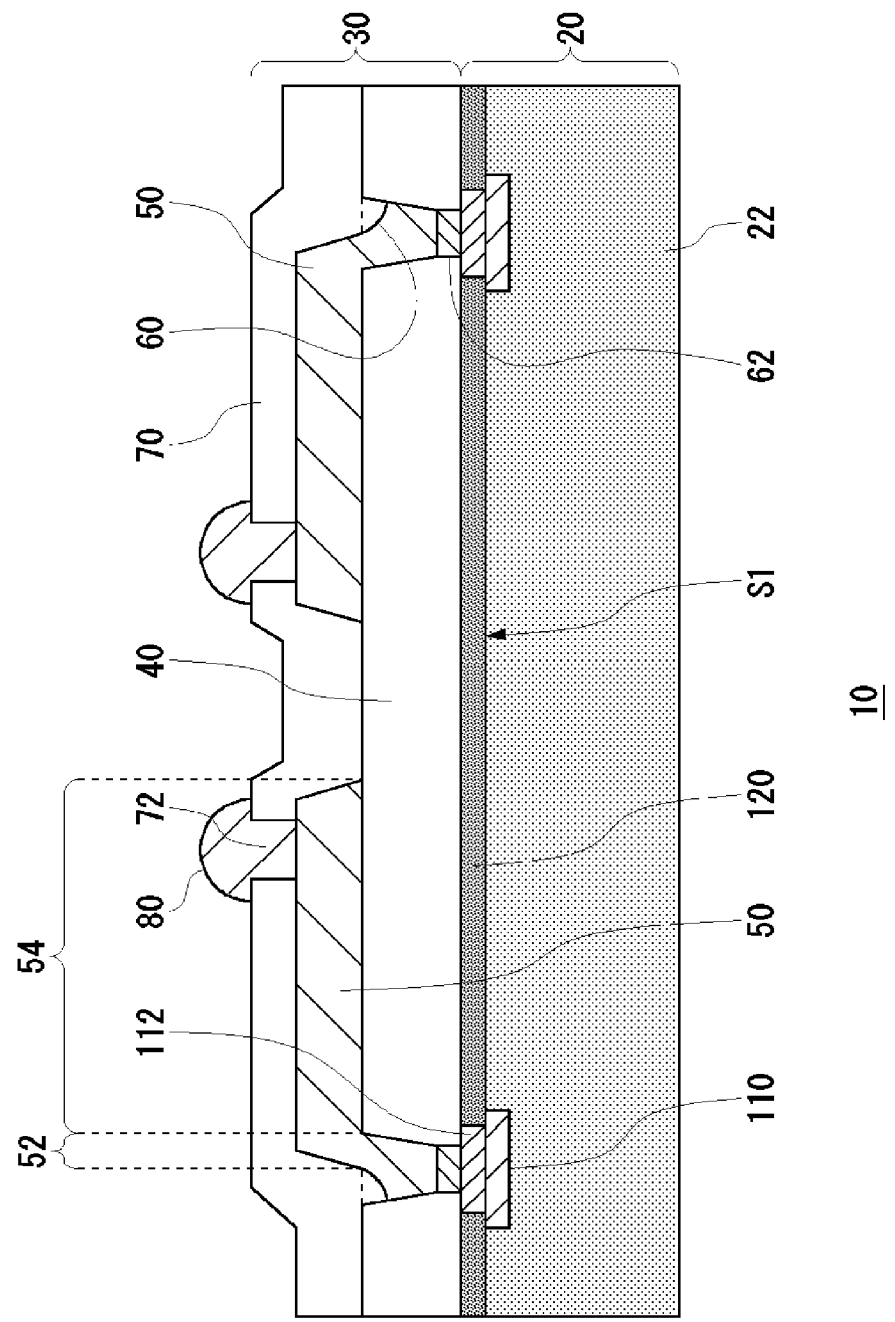
FIG. 13 is a cross-sectional view illustrating the structure of a semiconductor module according to Embodiment 3.

FIG. 13 is a cross-sectional view illustrating the structure of a semiconductor module 10 according to Embodiment 3. The basic structure of the semiconductor module 10 according to Embodiment 3 is the same as that of Embodiment 1. For this reason, with respect to the semiconductor module 10 according to Embodiment 2, descriptions of the same structure as Embodiment 1 will be omitted to focus on the structures different therefrom.

The present embodiment is characterized in that part of the height of the wiring layer 50 on the end side in the bump connection area 52 is lower than that of the wiring layer 50 in the wiring area 54 extending toward the side opposite to the end side. Further, in the present embodiment, the bump electrode 60 is projected in the lateral of the wiring layer 50 end in the bump connection area 52, and the surface of the bump electrode 60 opposite to the top surface thereof is exposed. The above points are the same characteristics as those in Embodiment 1. Further, in the present embodiment, part of the bump electrode 60 is lacking on the surface opposite to the top surface thereof, and the surface from which the bump electrode 60 is exposed is located lower than the underside of the wiring layer 50.

According to the structure of Embodiment 2, as in the same way as Embodiment 1, the stresses in the Z direction (direction in which the substrates are laminated) can also be suppressed from concentrated into the connection portion between the device electrode 110 and the bump electrode 60 in the bump connection area 52, the stresses being generated by thermal stresses occurring due to a difference between the coefficients of thermal expansion of the wiring layer 50 and the semiconductor substrate 22. As a result, the connection reliability between the bump electrode 60 and the device electrode 110, provided on the wiring layer 50, can be improved.

(Method of Manufacturing Device Mounting Board and Semiconductor Module according to Embodiment 3)

A basic method of manufacturing a device mounting board and a semiconductor module according to Embodiment 3 is the same as that of Embodiment 1. In the present embodiment, when forming the wiring layer by patterning the copper plate 200 illustrated in FIG. 5B, the cooper plate 200 only has to be over-etched such that the copper plate 200 is selectively removed and part of the bump electrode 60 is removed in the lateral of the wiring layer end.

(Application to Mobile Device)

Subsequently, descriptions will be made with respect to a mobile device provided with the semiconductor module according to present invention. An example in which the semiconductor module is mounted on a cell phone as the mobile device, will be shown; however, the mobile device may be an electronic device including, for example, a Personal Digital Assistant (PDA), a digital camcorder (DVC), and a digital still camera (DSC).

Figure 14:
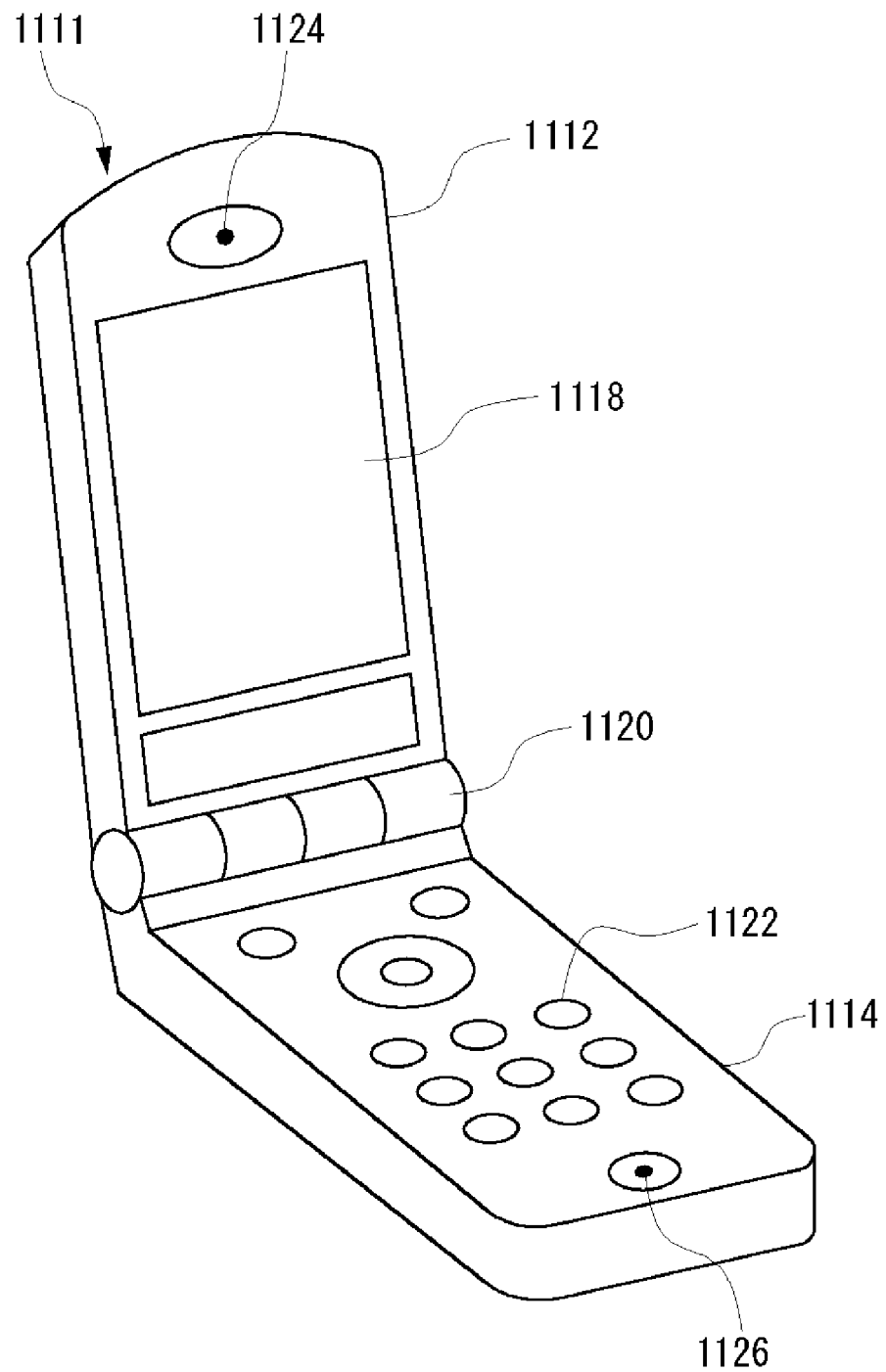
FIG. 14 is a view illustrating the structure of a cell phone provided with the semiconductor module according to Embodiments.

FIG. 14 is a view illustrating the structure of a cell phone provided with the semiconductor module 10 according to the embodiments. The cell phone 1111 is structured such that a first housing 1112 and a second housing 1114 are connected via a movable part 1120. The first housing 1112 and the second housing 1114 are movable around the movable part 1120. The first housing 1112 is provided with a display unit 1118 for displaying information including characters and images, and with a speaker unit 1124. The second housing 1114 is provided with an operation unit 1122 (e.g. operation buttons) and a microphone unit 1126. The semiconductor module according to any one of the respective embodiments is mounted inside the cell phone 1111 thus structured. The semiconductor module according to the present invention mounted in a cell phone as stated above, can be used in a power circuit for driving each circuit, an RF generating circuit for generating RF, a DAC, an encoder circuit, a backlight drive circuit as a light source for the liquid crystal panel adopted in the display unit of a cell phone, etc.

Figure 15:
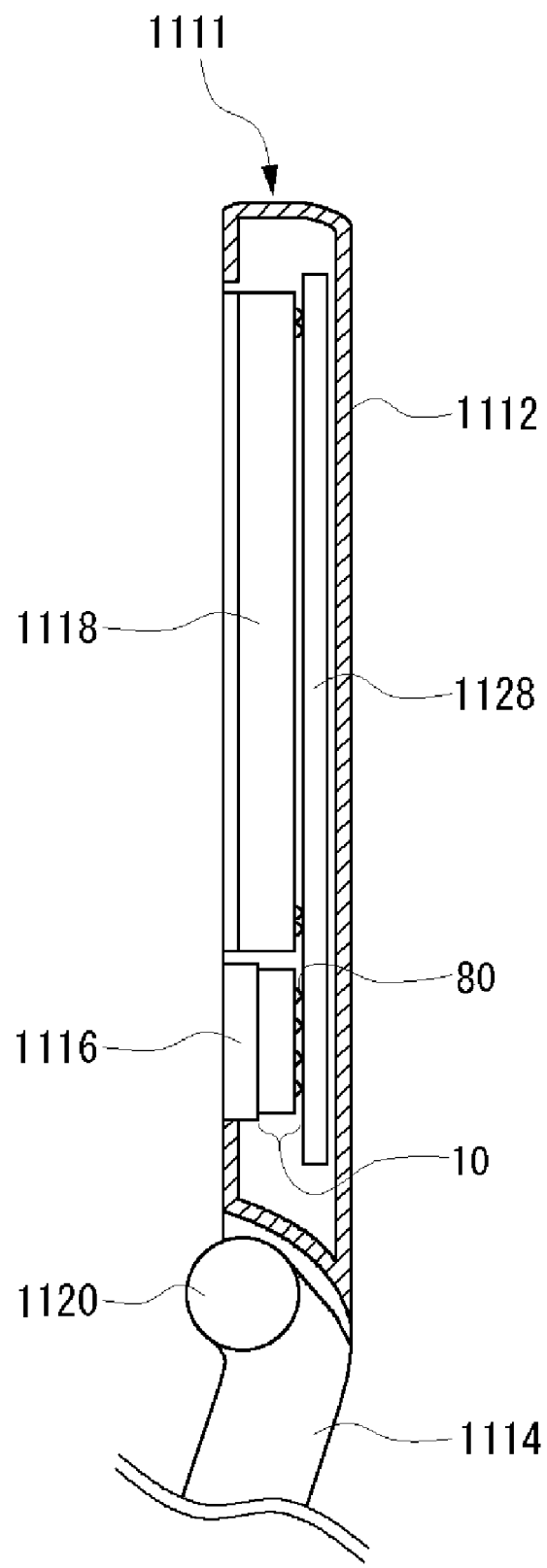
FIG. 15 is a partial cross-sectional view illustrating the cell phone in FIG. 14.

FIG. 15 is a partial cross-sectional view illustrating the cell phone in FIG. 14 (section of the first housing 1112). The semiconductor module 10 according to the embodiments of the present invention is mounted on a printed board 1128 via the solder ball 80 to be electrically connected to the display unit 1118, etc., via the printed board 1128. The underside of the semiconductor module 10 (surface opposite to the solder ball 80) is provided with a heat spreader 1116 such as a metal plate. For example, heat generated by the semiconductor module 10 is prevented from collected inside the first housing 1112 and is released outside the first housing 1112 efficiently.

According to the mobile device provided with the semiconductor module according to the embodiments of the present invention, the following effects can be acquired.

Because, in the semiconductor module 10, the connection reliability between the bump electrode 60 formed integrally with the wiring layer 50 and the device electrode 110 provided in the semiconductor device 20 are improved, the operation reliability of the semiconductor module 10 is improved, allowing the operation reliability of a mobile device mounted with the semiconductor module 10 thus structure to be improved.

Because the heat generated by the semiconductor module 10 can be efficiently released outside via the heat spreader 1116, temperature rise of the semiconductor module 10 can be suppressed, reducing the thermal stress between the conductive material and the wiring layer. Therefore, the conductive material inside the semiconductor module can be prevented from peeled off from the wiring layer, in comparison with the case where the heat spreader 1116 is not provided, allowing the reliability (heat-resistance reliability) of the semiconductor module 10 to be improved. As a result, the reliability (heat-resistance reliability) of the mobile device can be improved.

The semiconductor module 10 described in the aforementioned embodiments can be miniaturized, and hence mobile devices mounted with the semiconductor module 10 thus structured can be made thinner and miniaturized.

What is claimed is:

1. A device mounting board comprising:
    an insulating resin layer;
    a wiring layer provided on one major surface of the insulating resin layer; and
    a bump electrode electrically connected to the wiring layer at the end of the wiring layer, the bump electrode being provided in the insulating resin layer, wherein
    the height of part of the wiring layer on the end side is lower than that of the wiring layer in an area of the wiring layer extending toward the side opposite to the end side,
    a surface of the bump electrode opposite to a top surface of the bump electrode is lower than one major surface of the insulating resin layer and is not covered by the insulating resin layer, and
    a surface of the part of the wiring layer on the end side is continuous with the surface of the bump electrode opposite to the top surface of the bump electrode so that the continuous surfaces of the part of the wiring layer and the bump electrode become a curved surface.

2. The device mounting board according to claim 1, wherein the wiring layer and the bump electrode are formed integrally with each other.

3. A semiconductor module comprising:
    the device mounting board according to claim 1; and
    a semiconductor device on which a device electrode facing the bump electrode is provided, wherein the bump electrode penetrates the insulating resin layer such that the bump electrode and the device electrode are electrically connected together.

4. The semiconductor module according to claim 3, wherein the wiring layer and the bump electrode are formed integrally with each other.

* * * * *